United States Patent [19]
Schmidt et al.

[11] 4,057,395
[45] Nov. 8, 1977

[54] PROCESS FOR DETERMINING THE DONOR CONTENT OF POLYCRYSTALLINE SILICON OF HIGH PURITY TO BE USED IN THE SEMICONDUCTOR INDUSTRIES

[75] Inventors: Dietrich Schmidt, Burghausen, Germany; Karl Erwin Huber, Ach, Austria; Johann Hofer, Kirchdorf, Germany

[73] Assignee: Wacker-Chemitronic Gesellschaft fur Elektronik Grundstoffe mbH, Burghausen, Germany

[21] Appl. No.: 746,375

[22] Filed: Dec. 1, 1976

[30] Foreign Application Priority Data

Mar. 4, 1976  Germany .............................. 2608965

[51] Int. Cl.² ....................... G01N 27/04; G01N 25/38
[52] U.S. Cl. .............................. 23/230 R; 23/230 PC; 324/71 SN
[58] Field of Search ........................ 23/230 R, 230 PC; 423/324, 325; 324/71 SN

[56] References Cited
U.S. PATENT DOCUMENTS 3,540,861  11/1970  Bradley et al. ................ 23/230 R X

OTHER PUBLICATIONS

ASTM, "Standard Method for Preparing Silicon Single Crystals by Floating-zone Technique," Designation F41-68, p. 199, Section 3.5, 1972.

Primary Examiner—R.E. Serwin
Attorney, Agent, or Firm—Allison C. Collard

[57] ABSTRACT

Process for determining the donor content of polycrystalline silicon of high purity to be used in the semiconductor industries, the silicon having a known acceptor content of up to 0.02 atomic % and a donor content of up to 0.1 atomic %, the determination comprising the steps of introducing a test rod into a gas-tight quartz tube of only slightly larger internal diameter than the test rod, converting the rod into the oligocrystalline state by zone drawing with a seed crystal within a streaming protective gas, forming a melting zone in the test rod travelling vertically over the entire length, measuring the resistance of the so formed oligocrystalline test rod, and calculating the donor concentration from the measured resistance, the protective gas being a noble gas with an admixture of 10 – 800 ppm of oxygen.

6 Claims, 1 Drawing Figure

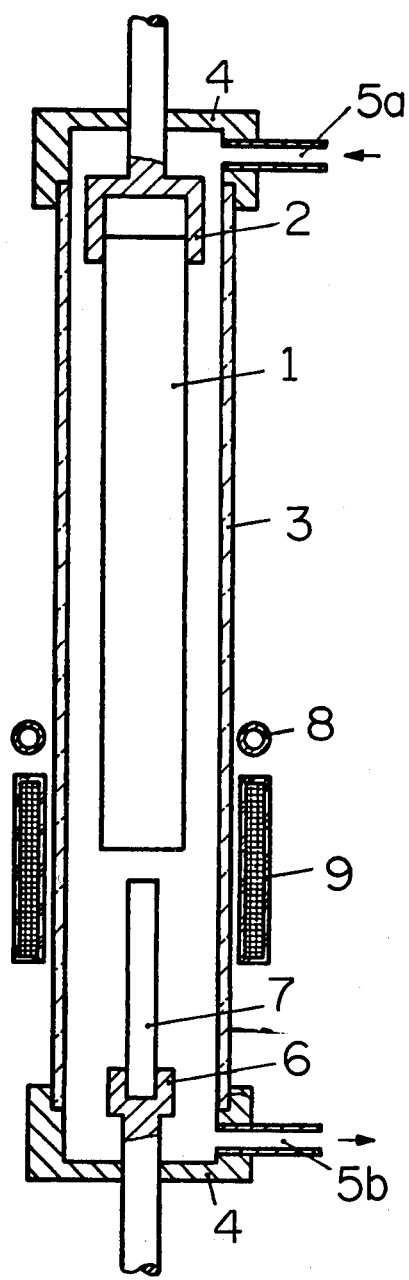

PROCESS FOR DETERMINING THE DONOR CONTENT OF POLYCRYSTALLINE SILICON OF HIGH PURITY TO BE USED IN THE SEMICONDUCTOR INDUSTRIES

The invention relates to a process for determining the donor content of polycrystalline silicon of high purity to be used in the semiconductor industries, the silicon containing at the most up to about 0.02 atomic % of acceptors and up to 0.1 atomic % of donors, the acceptor content being known. In a known process, the determination is made by introducing a test rod into a cylindrical gastight quartz tube having an internal diameter only slightly larger than the test rod. The test rod is then converted into the oligocrystalline state by zone drawing with a seed crystal within a streaming protective gas. An induction heating coil is used to encircle the quartz tube and a melting zone is formed in the test rod that travels with the heating coil vertically over the entire length, whereupon the resistance of the so formed oligocrystalline test body is being measured.

This process has been used for the determination of the donor concentration of a higher magnitude, with argon being used as protective gas. The disadvantage of the known process is the fact that the gage or indicator of the apparatus, often called "Keck Device" (German: KeckAnlage) lies at about 0.3 ppb of foreign atoms. Donor concentrations below 0.3 ppb are not determinable with that process. Up to now, such low donor concentrations can only be determined in zone-drawing devices consisting completely of metal, in which, for example, test rods bored out of polycrystalline material are converted below the protective gas into oligocrystalline material, only then being accessible to resistance measuring and thereby to the determination of donor concentration. However, this process frequently is accompanied by an effect called "back-sputtering", in which small particles from the tube wall or the induction heating coil immediately surrounding the melt zone enter the latter and thereby falsify the test result. A still more serious shortcoming is the long time required for carrying out the process, which involves cleaning the device by several pumping operations and subsequent rinsing with gas, all the more inconvenient because the drawing device in the last mentioned case has a larger volume than the "Keck Device."

The above mentioned circumstances are rather impotant for the semiconductor industries where polycrystalline silicon produced e.g. from trichlorosilane and hydrogen by deposition, has to be constantly tested for purity.

It is therefore an object of the present invention to provide an analytical process for the determination of the donor content in polycrystalline silicon to be used in the semiconductor industries, by which even donor cncentrations below 0.3 ppb can be measured rapidly and accurately.

The object is accomplished by the process of the invention in a surprisingly simple and inexpensive manner, by adding in the process described, 10 to 800 ppm of oxygen to the protective gas. It was quite unexpected that the gauge or indicator of the apparatus could be lowered to below 0.025 ppb of foreigh matter or impurities. As compared to the process carried out in devices consisting entirely of metal, the process according to the invention makes it possible to measure even low donor concentrations in much shorter time, without risk of "backsputtering" being present.

As mentioned before, the result accomplished by admixing oxygen to the protective gas, that is to lower the gauge or indicator of conventional quartz devices by about a decimal power was all the more unexpected, because of the generally existing prejudice that the protective gas to be used had to be extremely pure and must not contain more than negligible traces of oxygen. See e.g. ASTM "Standard Method for Preparing Silicon Single Crystals by Floating-zone Technique" Designation F 41-68, p. 199, Section 3.5, 1972.

The invention will now be more fully described in the schematic accompanying drawing illustrating an apparatus for carrying out the processs.

A rod-shaped test body 1, made of polycrystalline silicon, which was obtained in the usual manner by deposition from the gas phase, is to be measured for donor concentration. The acceptor concentration of the material is known or has been established previously. The test rod is about 10 to 30 cm long and has a diameter of 1 to 2.5 cm depending on the available quartz device.

Rod 1 is fastened to a holding member 2 rotatable about the vertical axis and placed into the drawing chamber consisting mainly of a quartz tube 3. The test rod diameter is so adjusted with respect to the tube diameter that it will be only a few mm, say 2.5 to 3.5 mm smaller than the tube diameter. The apparatus which is closed on top and bottom by metallic or plastic caps 4 and is provided with gas inlet tube 5a and gas escape tube 5b, is then rinsed with gas.

During the zone drawing proper, the operation is carried out at a protective gas pressure of 0.5 – 5 bar, preferably 0.8 – 2 bar, and a flow velocity of the gas of 5 – 1000, preferably 40 – 180 cm per second, measured between rod and surrounding tube wall. As protective gas, we use a noble gas, preferably argon, with an addition of 10 – 800, preferably 50 – 150, ppm of oxygen. The seed crystal to be used in the zone-drawing operation is shown at 7 mounted in a holding member 6 likewise rotatable about the vertical axis. Before the seed crystal, which may be lifted and lowered, is attached to the test rod 1 and the latter is melted by induction heating coil 8, the bottom end of the rod is heated to an initial heating temperature of 500° to 1400° C, preferably 600° to 1000° C by means of a heating ring 9 e.g. of carbon, which is provided below the induction heating coil 8. Seed crystal 7 is melted together with test rod 1 in a known manner and the rod is converted into oligocrystalline material by a single drawing operation.

Subsequently, the rod is taken out of the apparatus and its specific resistance is measured, as known, whereupon the donor content can be determined. If necessary, the value found may be reduced by the amount caused by the apparatus gauge.

The calculation of the donor content from the specific resistance is done in a known manner, for instance by using the tables of D. J. Irvin in "Bell System Technical Journal," vol. 41, p. 387 and foll., 1962. Recalculation of the donor content before zone-drawing can be accomplished if required, ASTM Poly Silicon Evaluation, 2nd draft, March 1972, p. 7.

The process of the invention will now be more fully described in the following examples, which are given by way of illustration and not of limitation.

EXAMPLE 1

To determine the apparatus gauge, a silicon rod of 20 cm length and a diameter of 1.8 cm, having a specific resistance of 15,000 ohm. cm, p, which had been drawn by a 7-zone drawing process, was used. The rod contained only boron as doping agent. The rod was placed in a quartz tube having an internal diameter of 2.1 cm and after its bottom end had been heated up initially by means of a carbon ring to about 1100° C, it was combined with a seed crystal, argon with 100 ppm oxygen admixed thereto, being used as protective gas, which passed through between rod and tube wall at a velocity of 120 cm/sec. A melting zone was formed which travelled in vertical direction through the entire length of the rod.

Subsequently, the rod was taken out of the tube and its specific resistance determined, which was found to be 15,000 ohm. cm, n. But since 15,000 ohm. cm, p, corresponds to an acceptor concentration of 0.018 ppb, which was overcompensated up to a specific resistance of 15,000 ohm. cm, n, corresponding to 0.007 ppb donor concentration, the resulting total donor concentration was 0.018 + 0.007 ppb, equalling 0.025 ppb, which was taken along from the apparatus into the rod as impurity.

EXAMPLE 2

From a poly rod, whose active donor concentration was to be determined, a test body was made by boring out of the material a piece, 20 cm long and 1.8 cm wide, which was placed in a quartz tube as described in Example 1, surrounded by argon with 100 ppm oxygen admixed, and zonedrawn. Subsequently, the piece was taken out and its specific resistance measured, which was 900 ohm. cm, n, corresponding to 0.12 ppb donor concentration. By reducing the figure by the apparatus gauge of 0.025 ppb, the active donor concentration was calculated as 0.095 ppb.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and intended to be, within the full range of equivalence of the following claims.

What is claimed is:

1. A process for determining the donor content of polycrystalline silicon of high purity to be used in the semiconductor industries, the silicon having a known acceptor content of up to at most 0.02 atomic % and a donor content of at most 0.1 atomic %, the determinaton comprising the steps of
    introducing a test rod into a gas-tight quartz tube having an internal diameter only slightly larger than the test rod,
    converting the rod into the oligocrystalline state by zone drawing with a seed crystal within a streaming protective gas,
    forming a melting zone in the test rod travelling vertically over the entire length,
    measuring the resistance of the so formed oligocrystalline test rod, and
    calculating the donor concentration from the measured resistance, the protective gas being a noble gas with an admixture of 10 – 800 ppm of oxygen.

2. The process as claimed in claim 1, wherein the admixture of oxygen amounts to 50 – 150 ppm.

3. The process as claimed in claim 1, wherein the protective gas is a mixture of argon with oxygen.

4. The process as claimed in claim 1, wherein the conversion of the rod-shaped test body into the oligocrystalline state is carried out under a pressure of 0.8 to 2 bar.

5. The process as claimed in claim 1, wherein the protective gas is passed along between the test rod and the quartz tube at a rate of 5 to 1000 cm per second.

6. The process as claimed in claim 5, wherein the rate at which the protective gas is passed along is from 40 – 180 cm per second.

* * * * *